(12) United States Patent
Yanagi et al.

(10) Patent No.: US 7,944,249 B2
(45) Date of Patent: May 17, 2011

(54) PHOTORECEIVING CIRCUIT

(75) Inventors: Hidenobu Yanagi, Kanagawa (JP); Hitoshi Imai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 142 days.

(21) Appl. No.: 12/372,762

(22) Filed: Feb. 18, 2009

(65) Prior Publication Data

US 2009/0219062 A1 Sep. 3, 2009

(30) Foreign Application Priority Data

Feb. 28, 2008 (JP) ................................. 2008-047427

(51) Int. Cl.
*H02M 11/00* (2007.01)
(52) U.S. Cl. ........................................ 327/103; 327/108
(58) Field of Classification Search .................. 327/103, 327/108
See application file for complete search history.

(56) References Cited

U.S. PATENT DOCUMENTS

| | | | | |
|---|---|---|---|---|
| 5,382,916 A | * | 1/1995 | King et al. ..................... 330/253 |
| 5,471,131 A | * | 11/1995 | King et al. ..................... 323/314 |
| 5,734,293 A | * | 3/1998 | Gross ............................. 327/561 |
| 5,880,610 A | * | 3/1999 | Nishizono et al. ............. 327/103 |
| 6,714,063 B2 | * | 3/2004 | Nishizono ..................... 327/345 |
| 2003/0219260 A1 | * | 11/2003 | Chiou et al. ................... 398/202 |
| 2005/0046448 A1 | * | 3/2005 | Ha et al. ........................ 327/103 |

FOREIGN PATENT DOCUMENTS

JP       60-190011       9/1985

* cited by examiner

*Primary Examiner* — Lincoln Donovan
*Assistant Examiner* — Ryan C Jager
(74) *Attorney, Agent, or Firm* — Young & Thompson

(57) ABSTRACT

A buffer circuit includes a first transistor (T1) having a base connected to a first power supply, the emitter (E1) and collector (C1) connected as input and output nodes, a second transistor (T2) having a base connected to the first power supply, a first constant current circuit using a difference between outgoing current from E1 and an input current at the current signal input node as a constant current, and determining outgoing current from the emitter of T2 equal to the constant current; and a first mirror circuit equalizing first and second collector currents with a third transistor (T3) with C1 and a fourth transistor (T4) with a collector connected to a collector of T2, a first operating point voltage is provided to the current signal output node between T3 and T1, and a second operating point voltage based on the first operating point voltage between T4 and T2.

19 Claims, 7 Drawing Sheets

PHOTORECEIVING CIRCUIT

BACKGROUND

1. Field of the Invention

The present invention relates to a buffer circuit and a photoreceiving circuit using the same.

2. Description of Related Art

In recent years, recording media such as CDs and DVDs have been widely spread. Such optical recording media are fabricated with dedicated recorders, and techniques are developed daily to improve the recording rate. A photoreceiving IC provided on a pickup unit in such a recorder has a function that converts light reflected from an optical disk into a current with a photoreceiving device and converts it into a voltage signal in a current-voltage conversion circuit. In order to enhance the speed of a recorder, it is required to enhance the speed of a photoreceiving IC used in a pickup unit.

FIG. 7 shows a related circuit diagram disclosed in Japanese unexamined Patent Application Publication No. 60-190011. As shown in FIG. 7, the related example has a configuration in which a PD 2 functioning as an input source is connected to an emitter of a transistor 14. A base of the transistor 14, whose base is grounded, has a small impedance, and furthers the impedance of the emitter is extremely small value because it is a product of the base impedance and a reciprocal of a current amplification rate. This reduces the influence on the frequency characteristics due to parasitic capacitance component of the PD 2. FIGS. 8A and 8B show graphs of the frequency characteristics in this case. Using the transistor 14 enables to obtain good frequency characteristics without generating a peak even in a case that the parasitic capacitance of the PD 2 varies.

The following sections describe the offset voltage in the related example of FIG. 7.

The sum of the emitter current of the transistor 14 and input current $I_{PD}$ from the PD 2 is fixed at constant current I by a constant current circuit 15. Accordingly, collector current $I_{C1}$ of the transistor 14 is, when the base current is defined as $I_{B1}$, expressed as:

$$I_{C1} = I - I_{PD} - I_{B1} \quad (1).$$

Collector current $I_{C2}$ of a transistor 18 provided as a reference current is, when the base current is defined as $I_{B2}$, expressed as:

$$I_{C2} = I - I_{B2} \quad (2).$$

Since $I_{C1}$ and $I_{C2}$ become almost equal by a current mirror circuit 16, current IR flowing in a resistor 17 is expressed as:

$$IR = I_{C2} - I_{C1} = I_{PD} + I_{B1} - I_{B2} \quad (3).$$

Further, when the transistors 14 and 18 have an identical transistor configuration in which the following relationship holds:

$$I_{B1} = I_{B2} \quad (4),$$

an output signal voltage $V_s$ is expressed as, in a case of a voltage Vref as a reference, defining the value of the resistor 17 as R:

$$V_S = IR \times R = I_{PD} \times R \quad (5).$$

According to Expression (5), the offset voltage in a case of no optical input ($I_{PD}=0$) is, expressed as:

$$V_S = I_{PD} \times R = 0,$$

and understood that it is not generated.

The following sections describe the offset voltage in the related photoreceiving IC shown in FIG. 7, in a case that power supply voltage Vcc or voltage Vref varies.

In the current mirror circuit 16, the collector-emitter voltage of a transistor 19 has a value equivalent to each base-emitter voltage of the transistors 20 and 21, and thus always becomes constant. In contrast, since the collector voltage of the transistor 21 is voltage Vref, the collector-emitter voltage varies depending on power supply voltage Vcc or voltage Vref.

For this reason, although collector current $I_{C2}$ of the transistor 19 is constant relative to the variation of power supply voltage Vcc and voltage Vref, collector current $I_{C1}$ of the transistor 21 varies depending on the Early voltage effect. Hence, $I_{C1}$ and $I_{C2}$ become out of balance to generate power supply voltage dependence of the offset voltage. The Early voltage effect of the transistor is expressed as:

$$I_C = I_S(1 + V_{CE}/V_A)\exp(V_{BE}/V_T) \quad (6),$$

$I_S$: a constant indicating transfer characteristics of the transistor in the forward active region,
$V_A$: the Early voltage,
$V_T = kT/q \approx 26$ mV at 300 K.

The following sections discuss the influence mentioned above in the related photoreceiving IC in FIG. 7. In this discussion, current variation generated by the power supply voltage variation is indicated by adding Δ to the names of current shown in FIG. 7.

A current change ΔIR due to the power supply voltage variation is added in Expression (3), and Expression (4) of the relationship of the base current and Expression (6) of the Early voltage effect are substituted in the added expression as:

$$IR + \Delta IR = (I_{C2} - I_{C1}) + (\Delta I_{C2} - \Delta I_{C1}) \quad (7)$$
$$= I_{PD} + I_S\{(\Delta V_{CE2} - \Delta V_{CE1})/V_A\}\exp(V_{BE}/V_T).$$

In Expression (7), $\Delta V_{CE2}$ denotes the collector-emitter voltage variation of the transistor 19, and $\Delta V_{CE1}$ is the collector-emitter voltage variation of the transistor 20.

When the following expressions are supposed to hold:

$$\Delta V_{CE} = \Delta V_{CE2} - \Delta V_{CE1} \quad (8);$$

$$IR + \Delta IR = I_{PD} + I_S(\Delta V_{CE}/V_A)\exp(V_{BE}/V_T) \quad (9),$$

addition of an output voltage change $\Delta V_S$ generated by the power supply voltage variation into Expression (5) is expressed as:

$$V_S + \Delta V_S = (IR + \Delta IR) \times R \quad (10)$$
$$= \{I_{PD} + I_S(\Delta V_{CE}/V_A)\exp(V_{BE}/V_T)\}R.$$

The offset voltage in a case of no optical input ($I_{PD}=0$) is expressed as:

$$V_S + \Delta V_S = \{I_S(\Delta V_{CE}/V_A)\exp(V_{BE}/V_T)\} \times R \quad (11).$$

According to Expression (11), it is found that the difference $\Delta V_{CE}$ between the collector-emitter voltages generated by the power supply voltage variation becomes a variable and the offset voltage varies. The related example does not disclose means to solve such problem.

SUMMARY

The present inventor has recognized that the related example has the problem of varying the offset voltage due to the difference $\Delta V_{CE}$ between the collector-emitter voltages generated by the power supply voltage variation.

An exemplary aspect of an embodiment of the present invention is a buffer circuit including a first transistor having a base connected to a first power supply, an emitter as a current signal input node, and a collector as a current signal output node, a second transistor having a base connected to the first power supply, a first constant current circuit using a difference between outgoing current from the emitter of the first transistor and an input current at the current signal input node as a constant current, and determining outgoing current from the emitter of the second transistor as a current same as the constant current; and a first mirror circuit that makes a collector current of the first transistor equal to a collector current of the second transistor in which the first mirror circuit has a third transistor with a collector connected to the collector of the first transistor and a fourth transistor with a collector connected to a collector of the second transistor, a first operating point voltage is provided to the current signal output node between the third transistor and the first transistor, and a second operating point voltage based on the first operating point voltage is provided to a node between the fourth transistor and the second transistor.

In this manner, the collector voltages of the third and fourth transistors of the first mirror circuit can be configured to depend on the first operating point voltage. This enables to suppress an difference between the collector-emitter voltages due to the power supply voltage variation and reduce the power supply voltage dependence of the offset voltage.

An exemplary aspect of an embodiment of the present invention is a photoreceiving circuit including a first transistor having a base connected to a first power supply and provided between a photoreceiving device and a current-voltage conversion circuit, a second transistor having a base connected to the first power supply, a first constant current circuit using a difference between outgoing current from the emitter of the first transistor and an input current at the current signal input node as a constant current, and determining outgoing current from the emitter of the second transistor as a current same as the constant current, a first mirror circuit that makes a collector current of the first transistor equal to a collector current of the second transistor; and a second constant current circuit functioning as a reference current of the first mirror circuit in which the first mirror circuit has a third transistor with a collector connected to the collector of the first transistor and a fourth transistor with a collector connected to a collector of the second transistor, a first operating point voltage is provided to the current signal output node between the third transistor and the first transistor, and a second operating point voltage based on the first operating point voltage is provided to a node between the fourth transistor and the second transistor.

In this manner, adding the third constant current circuit enables to separately dispose a reference transistor of the first mirror circuit and configure the transistor that is not used as the reference of the first mirror circuit to have the collector voltage depending on the power supply voltage. This enables to inhibit the offset between the collector-emitter voltages due to the power supply voltage variation and reduce the power supply voltage dependence of the offset voltage.

According to the present invention, it is possible to provide a buffer circuit, capable of eliminating an difference between collector-emitter voltages due to a power supply voltage variation and allowing the offset voltage to have good power supply voltage dependence, and a photoreceiving circuit using the same.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 8A and 8B show graphs of the frequency characteristics in a photoreceiving circuit provided with a common base transistor.

DETAILED DESCRIPTION OF THE EXEMPLARY EMBODIMENTS

First Exemplary Embodiment

Figure 1:
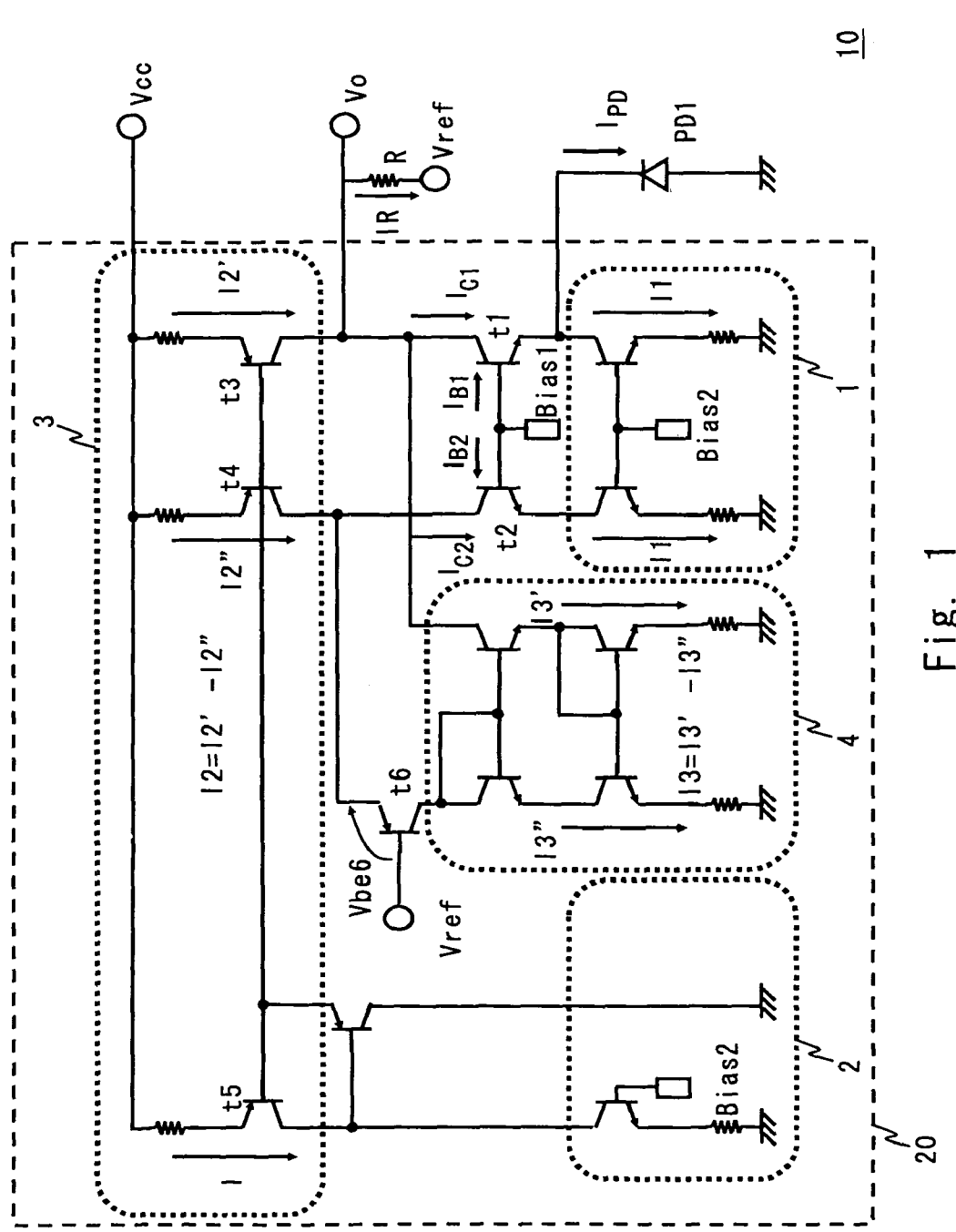
FIG. 1 is a diagram showing a configuration of a photoreceiving circuit provided with a buffer circuit according to a first exemplary embodiment.

Referring to FIG. 1, a description is given of a photoreceiving circuit provided with a buffer circuit according to first exemplary embodiment of the present invention. FIG. 1 is a diagram showing a configuration of a photoreceiving circuit 10 provided with a buffer circuit 20 according to the first exemplary embodiment. As shown in FIG. 1, the photoreceiving circuit 10 according to the first exemplary embodiment is provided with a photoreceiving device PD1 and the buffer circuit 20. The buffer circuit 20 includes a first constant current circuit 1, a second constant current circuit 2, a first mirror circuit 3, and a second mirror circuit 4. The present invention relates to a photoreceiving circuit that reduces influence of parasitic capacitance of the photoreceiving device PD (photodiode), which functions as an input source, and that inhibits power supply voltage variation of offset voltage characteristics.

As shown in FIG. 1, PD1 functioning as an input source is connected to an emitter of a transistor t1. The transistor t1 has a base connected to a power supply Bias1, the emitter as a current signal input node, and a collector as a current signal output node. PD1 is accordingly connected to the current signal input node of the transistor t1. The base of the transistor t1 and a base of a transistor t2 are connected to the same power supply Bias1. The transistor t2 is provided on the reference side to make the same amount of current flow therethrough as the current flowing through the transistor t1.

Both emitters of the transistors t1 and t2 are connected to the first constant current circuit 1 having an NPN transistor for each of the emitters. The first constant current circuit 1 includes a constant current circuit, using a difference between outgoing current from the emitter of the transistor t1 and input current at the current signal input node as a constant current, and a constant current circuit, determining outgoing current from the emitter of the transistor t2 as a current same as the constant current.

The collectors of the transistors t1 and t2 are connected to the first mirror circuit 3 having PNP transistors in order to apply a current generated by the second constant current circuit 2 to them. The first mirror circuit 3 makes the collector current of the transistor t1 equal to the collector current of the transistor t2.

The first mirror circuit 3 is configured with reference to a transistor t5. The transistor t5 has a collector to which the second constant current circuit 2 is connected The second constant current circuit 2 provides a reference current of the first mirror circuit 3. Currents in the first constant current circuit 1 and the first mirror circuit 3 are determined by separate current sources, respectively.

The first mirror circuit 3 has a transistor t3 with a collector connected to the collector of the transistor t1, and a transistor t4 with a collector connected to the collector of the transistor t2. There is a current signal output node between the transistors t3 and t1. A voltage, depending on Vref, that functions as a first operating point voltage is provided to the current signal output node. In addition, a second operating point voltage based on the first operating point voltage is provided to a node between the transistors t4 and t2.

In the first exemplary embodiment, an emitter of a transistor t6 is connected to the node between the transistors t4 and t2. Voltage Vref, which functions as a reference voltage of output Vo, is provided for a base of the transistor t6. Accordingly, the collector voltage of the transistor t4 depends on voltage Vref.

A second mirror circuit 4 is provided as a circuit that makes a differential current corresponding to the difference in current between the first constant current circuit 1 and the first mirror circuit 3 flow therethrough. That is, a differential current between the first constant current circuits 1 and 2 flows in the second mirror circuit 4. It should be noted that the first mirror circuit 3 and the second mirror circuit 4 may be in any form although the first exemplary embodiment employs Wilson type circuits, which have good offset absolute value characteristics.

The following sections describe the operation of the photoreceiving circuit 10 shown in FIG. 1. The circuit operation is described firstly in a case that the power supply voltage is considered to be constant Since collector current $I_{C1}$ of the input transistor t1 is a difference by subtracting base current $I_{B1}$ of the transistor t1 from constant current $I_1$ and input current $I_{PD}$ from the photoreceiving device, collector current $I_{C1}$ is expressed as:

$$I_{C1}=I_1+I_{PD}-I_{B1} \quad (12).$$

When the base current of the transistor t2 is defined as $IB_2$, collector current $I_{C2}$ of the reference transistor t2 is expressed as:

$$I_{C2}=I_1-I_{B2} \quad (13).$$

When a current flowing in the transistor t3 is defined as $I_2'$ and a current flowing in the transistor t4 is defined as $I_2''$, both transistors configuring the first mirror circuit 3, differential current $I_2$ between them is expressed as:

$$I_2=I_2'-I_2'' \quad (14).$$

Since each pair of the transistors t1 and t2 and the transistors t3 and t4 is configured with identical transistors, the following expressions are satisfied.

$$I_{B1}=I_{B2} \quad (15)$$

$$I_2=I_2'-I_2''=0 \quad (16)$$

In the second mirror circuit 4, reference current $I_3''$ is a differential current between current $I_2''$ of the first mirror circuit 3 and collector current $I_{C2}$ of the transistor t2, and the other current $I_3'$ is a differential current between current $I_2'$ of the first mirror circuit 3 and collector current $I_{C1}$ of the transistor t1 and current IR flowing in an output resistor R. Therefore, the following expressions hold:

$$I_3''=I_2''-I_{C2} \quad (17),$$

$$I_3'=I_2'-I_{C1}-IR \quad (18).$$

Since all transistors and resistors of the second mirror circuit 4 have identical configuration, respectively, the following expression holds:

$$I_3'=I_3'' \quad (19).$$

According to Expressions (17), (18), and (19), current IR flowing in the output resistor R, is expressed as:

$$IR=(I_2'-I_2'')+(I_{C2}-I_{C1}) \quad (20).$$

In addition, according to Expressions (12), (13), (14), and (15), the following expression holds:

$$IR=I_{C2}-I_{C1}=I_{PD}+I^{B1}-I_{B2}=I_{PD} \quad (21).$$

Output voltage Vo is expressed as:

$$Vo=IR \times R=I_{PD} \times R \quad (22).$$

According to Expression (22), the offset voltage in a case of no optical input ($I_{PD}=0$) is expressed as:

$$Vo=I_{PD} \times R=0,$$

and thus it is understood that no offset voltage is generated.

The circuit operation is described secondly in a case that power supply voltage Vcc or voltage Vref is varied in the photoreceiving circuit 10 in FIG. 1. Current variation due to the power supply voltage variation is indicated by adding Δ to the names of current shown in FIG. 1. In addition, current variation upon power supply voltage variation depends on the Early voltage effect, and it can be expressed as below:

$$I_C=I_S(1+V_{CE}/V_A)\exp(V_{BE}/V_T) \quad (23),$$

$I_S$: a constant indicating transfer characteristics of the transistor in the forward active region,
$V_A$: the Early voltage,
$V_T=kT/q \approx 26$ mV at 300 K.

It should be noted that, since PNP transistors generally have lower Early voltage relative to NPN transistors and the Early voltage effect of PNP transistors has a dominant influence, the Early voltage effect of NPN transistors is omitted in the description below.

When $\Delta V_{CE1}$ and $\Delta V_{CE2}$ denote the collector-emitter voltage variations due to the power supply voltage of the transistors t1 and t2, respectively, collector currents $\Delta I_{C1}$ and $\Delta_{C2}$ are expressed as:

$$\Delta I_{C1}=\Delta I_1-\Delta I_{PD}-\Delta I_{B1}+I_S(1+\Delta V_{CE1}/V_A)\exp(V_{BE}/V_T) \quad (24),$$

$$\Delta I_{C2}=\Delta I_1-\Delta I_{B1}+I_S(1+\Delta V_{CE2}/V_A)\exp(V_{BE}/V_T) \quad (25).$$

Since input current $I_{PD}$ does not change for the power supply voltage variation, the following expression holds:

$$\Delta I_{PD}=0.$$

Accordingly, Expression (24) turns out to be:

$$\Delta I_{C1}=\Delta I_1-\Delta I_{B1}+I_S(1+\Delta V_{CE1}/V_A)\exp(V_{BE}/V_T) \quad (26).$$

Then, when $\Delta V_{CE3}$ and $\Delta V_{CE4}$ denote the collector-emitter voltage variations due to the power supply voltage of the transistors t3 and t4, respectively, currents $\Delta I_2'$ and $\Delta I_2''$ flowing in the transistors t3 and t4 are expressed as:

$$\Delta I_2' = I_S(1+\Delta V_{CE3}/V_A)\exp(V_{BE}/V_T) \quad (27),$$

$$\Delta I_2'' = I_S(1+\Delta V_{CE4}/V_A)\exp(V_{BE}/V_T) \quad (28).$$

The difference between $\Delta I_2'$ and $\Delta I_2''$ is defined as $\Delta I_2$.

$$\begin{aligned}\Delta I_2 &= \Delta I_2' - \Delta I_2'' \\ &= I_S\{(\Delta V_{CE3} - \Delta V_{CE4})/V_A\}\exp(V_{BE}/V_T)\end{aligned} \quad (29)$$

When $\Delta V_{CE}$ denotes the difference between collector-emitter voltage variations of the transistors t3 and t4, the following expression holds:

$$\Delta V_{CE} = \Delta V_{CE3} - \Delta V_{CE4}$$

Therefore, according to Expression (29), $\Delta I_2$ is expressed as:

$$\Delta I_2 = I_S(\Delta V_{CE}/V_A)\exp(V_{BE}/V_T) \quad (30).$$

According to Expression (30), factors for generating $\Delta I_2$ include the difference $\Delta V_{CE}$ between collector-emitter voltage variations of the transistors t3 and t4 in a case of power supply voltage variation. The photoreceiving circuit 10 according to the present invention, however, has the transistor t3 with the collector-emitter voltage depending on voltage Vref. Moreover, the collector of the transistor t4 is connected to the emitter of the transistor t6 having the base to which voltage Vref is provided. Hence, both collector-emitter voltages have a configuration depending on voltage Vref.

Consequently, the difference between collector-emitter voltage variations of the transistors t3 and t4 relative to the power supply voltage variation is expressed as:

$$\Delta V_{CE} = 0.$$

Accordingly, the difference $\Delta I_2$ of current variations due to the Early voltage is expressed as:

$$\Delta I_2 = I_S(\Delta V_{CE}/V_A)\exp(V_{BE}/V_T) = 0.$$

Also, collector voltages in the transistors t1 and t2 have a configuration depending on voltage Vref. With this account, since the current changes due to the collector-emitter voltage variations turn out to be equal, the following expressions hold:

$$\Delta I_{B1} = \Delta I_{B2} \quad (31),$$

$$\Delta V_{CE1} = \Delta V_{CE2} \quad (32).$$

Current $\Delta IR$ flowing in the resistor R is expressed as:

$$\begin{aligned}\Delta IR &= \Delta I_{C2} - \Delta I_{C1} + \Delta I_2 \\ &= \Delta I_{PD} + I_S\{(\Delta V_{CE2} - \Delta V_{CE1})/V_A\}\exp(V_{BE}/V_T) \\ &= 0.\end{aligned}$$

The following expression incorporates the current change $\Delta IR$ due to the power supply voltage variation into Expression (21):

$$IR + \Delta IR = I_{PD} \quad (33)$$

Still following expression incorporates the current change $\Delta Vo$ due to the power supply voltage variation into Expression (22):

$$Vo + \Delta Vo = (IR + \Delta IR) \times R = I_{PD} \times R \quad (34).$$

As understood from Expression (34), power supply voltage dependence of the offset voltage is not generated when there is no optical input ($I_{PD}=0$), even in a case that power supply voltage Vcc or voltage Vref varies.

Figure 2A:
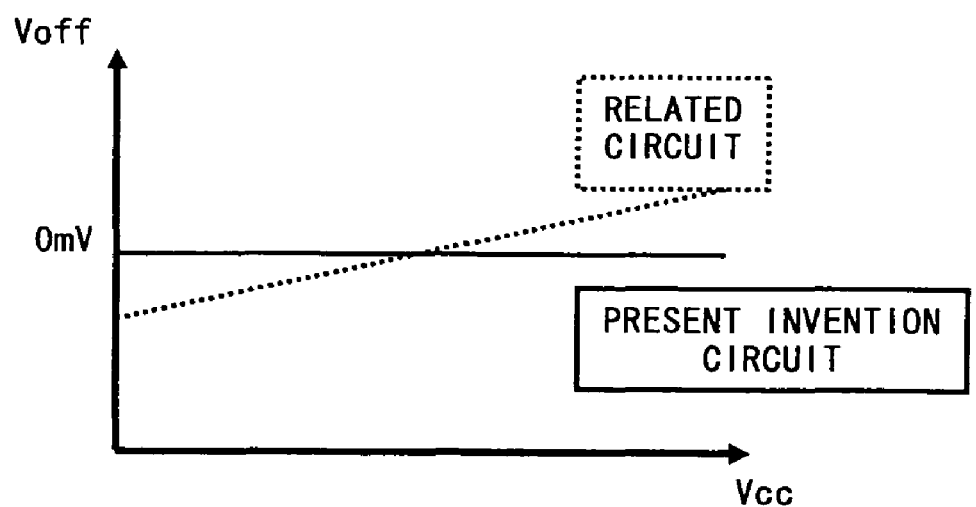
FIGS. 2A and 2B are graphs showing a power supply voltage dependency of the offset voltage of the photoreceiving circuit according to a first exemplary embodiment.
Figure 2B:
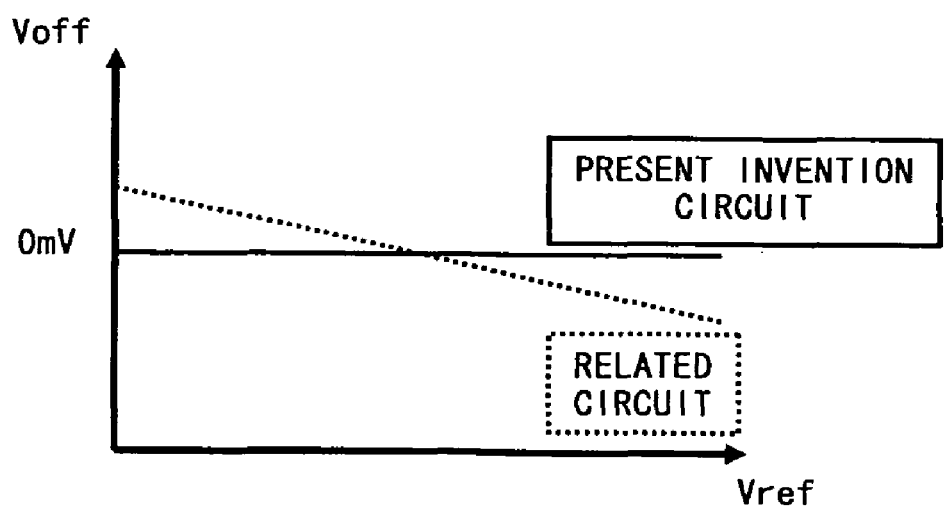

FIGS. 2A and 2B show power supply voltage dependence of the offset voltage in a photoreceiving circuit according to the first exemplary embodiment and a related photoreceiving circuit in case of no optical input ($I_{PD}=0$) FIG. 2A shows a case of Vcc variation, and FIG. 2B shows a case of Vref variation. In FIGS. 2A and 2B, a solid line indicates a photoreceiving circuit according to the present invention, and a broken line indicates a related photoreceiving circuit. As shown in FIGS. 2A and 2B, in the present invention, power supply voltage dependence is not generated in the offset voltage when there is no optical input even in a case that power supply voltage Vcc or voltage Vref varies.

Figure 8A:
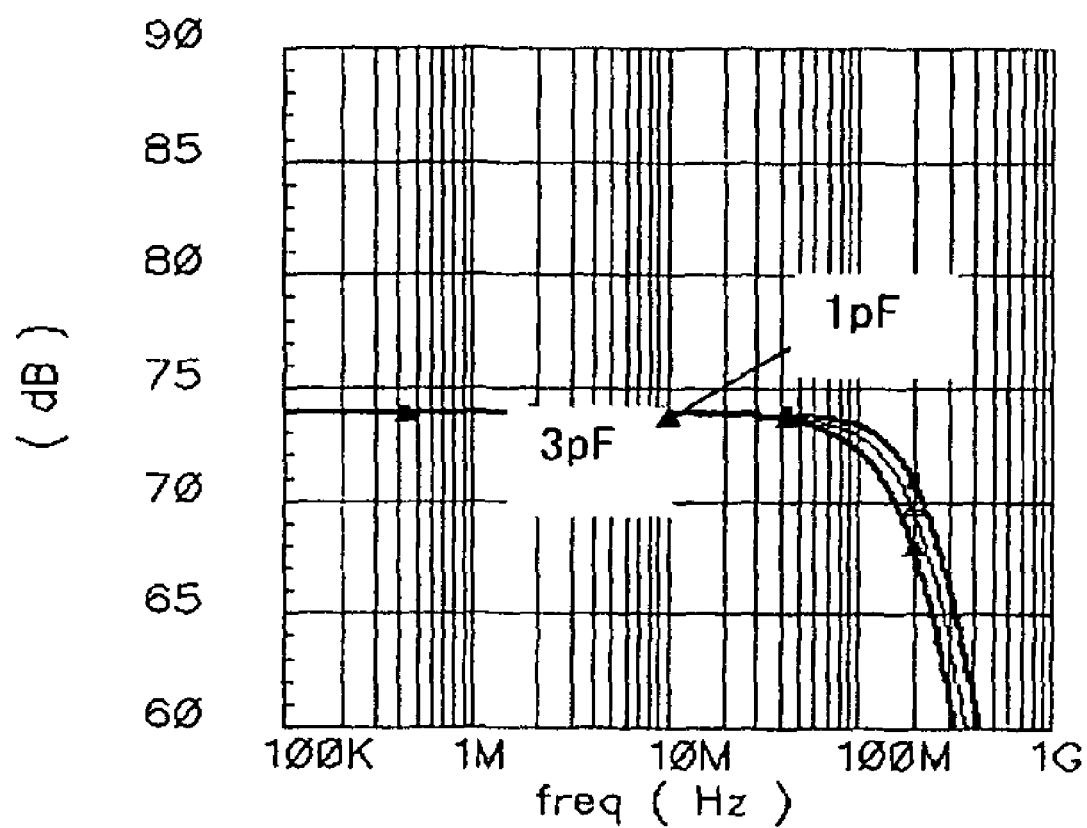

It should be noted that, in the first exemplary embodiment same as the related art, PD1 functioning as an input source is connected to the emitter of the common base transistor t1. This enables to reduce influence from parasitic capacitance of PD1. As shown in FIGS. 8A and 8B, using a common base transistor enables to obtain an effect of stabilizing frequency characteristics without generating a peak even in a case that the parasitic capacitance of PD1 varies.

Moreover, using the second constant current circuit 2 and the first mirror circuit 3 enables to eliminate a collector-base short circuit of the reference transistor t4. Furthermore, using the transistor t6 enables to provide a potential with power supply dependence equivalent to a collector potential of the input transistor t3 for a collector potential of the transistor t4. Since this keeps the difference between the collector-emitter voltages of the transistors t3 and t4 always constant even in a case that the power supply voltage varies, the difference between the current variations due to the Early voltage becomes zero and thus the offset voltage characteristics have good power supply voltage variation as in FIGS. 2A and 2B.

Second Exemplary Embodiment

Figure 3:
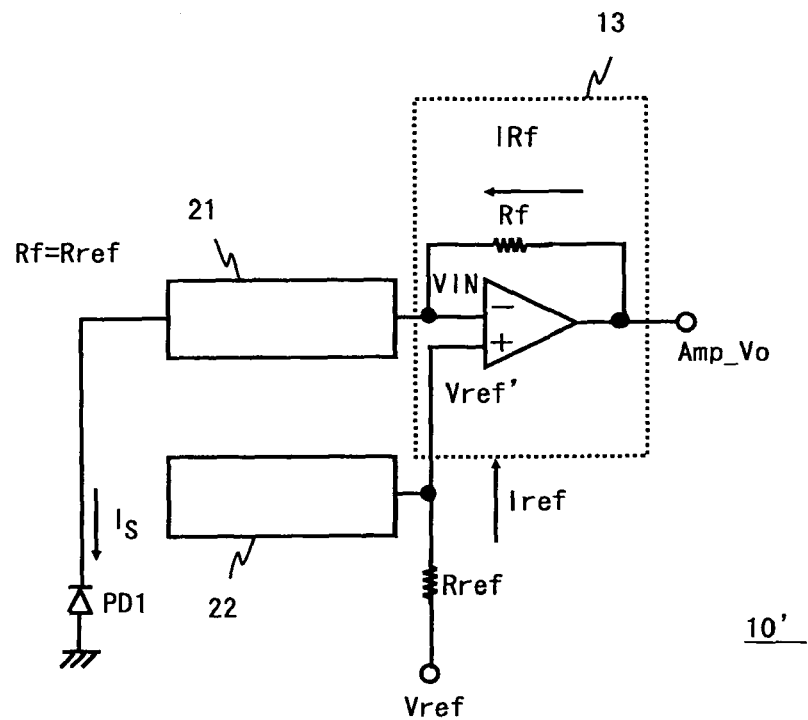
FIG. 3 is a diagram showing a configuration of the photoreceiving circuit provided with a buffer circuit according to a second exemplary embodiment.
Figure 4:
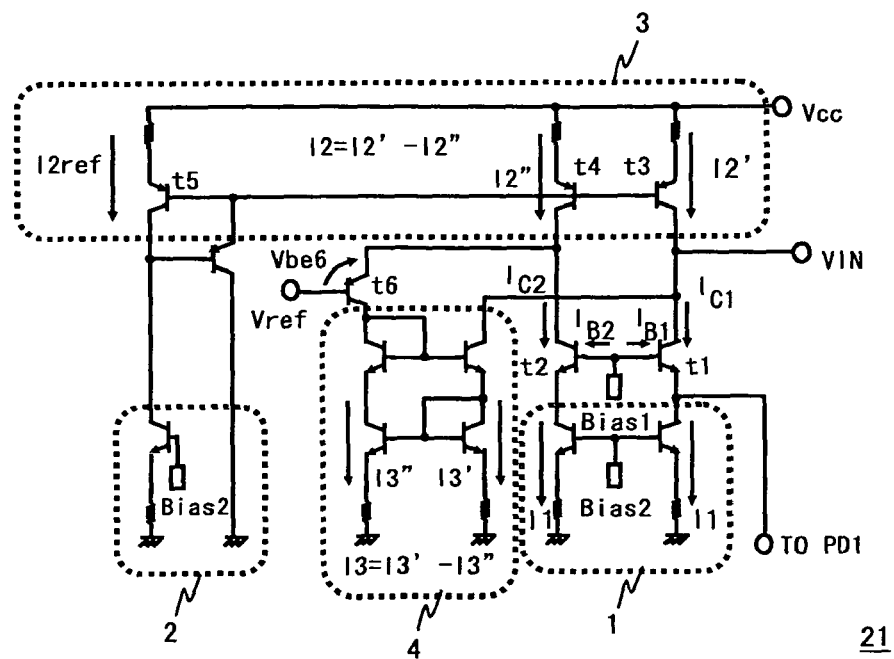
FIG. 4 is a diagram showing a configuration of a first buffer circuit in FIG. 3.
Figure 5:
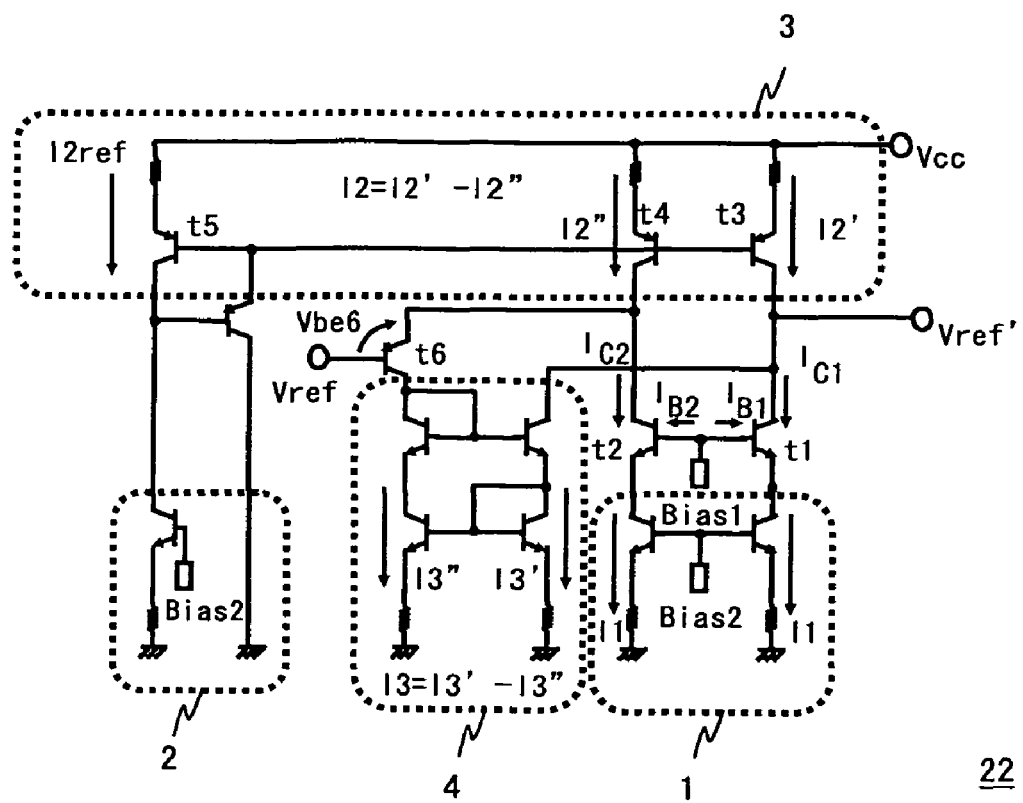
FIG. 5 is a diagram showing a configuration of a second buffer circuit in FIG. 3.

Referring to FIGS. 3 through 5, a description is given of a photoreceiving circuit 10' using a buffer circuit according to second exemplary embodiment of the present invention. FIG. 3 is a diagram showing a configuration of the photoreceiving circuit 10' according to the second exemplary embodiment. FIG. 4 is a diagram showing a configuration of a first buffer circuit 21 in FIG. 3, and FIG. 5 is a diagram showing a configuration of a second buffer circuit 22 in FIG. 3. In FIGS. 3 through 5, the same reference numeral is used for an element identical to that of FIG. 1, and the description is omitted as appropriate.

As shown in FIG. 3, in the photoreceiving circuit 10', the first buffer circuit 21 is connected to an inverting input terminal (input side) of an I/V conversion operational amplifier 13, which is a differential operational amplifier for current-voltage conversion, and the second buffer circuit 22 is connected to a non-inverting input terminal (reference side). As shown in FIGS. 4 and 5, the first buffer circuit 21 and the second buffer circuit 22 in the photoreceiving circuit 10' according to the second exemplary embodiment have a circuit configuration equivalent to the buffer circuit 20 described in the first exemplary embodiment.

In a case of input current $I_{PD}=0$, it is desirable that the current is balanced by the constant current circuits and the mirror circuits to make the input from the first buffer circuit 21 to the I/V conversion operational amplifier 13 zero. However, in a case that a deviation of balance is generated in the mirror circuits due to, for example, relative variations of transistors, current IRf flows in a feedback resistor Rf of the I/V conversion operational amplifier 13 to generate an offset voltage to voltage Amp_Vo with reference to voltage Vref.

In the circuit configuration shown in FIG. 3, the second buffer circuit 22 having a similar circuit configuration is connected to a noninverting input terminal, which is the reference side of the I/V conversion operational amplifier 13. Consequently, current IRf flowing in the feedback resistor Rf becomes equivalent to current Iref flowing in a reference resistor Rref. This enables to apply an equivalent current to the reference side even in a case that the balance of the buffer circuit according to the present invention is deviated, and in a case of Rf=Rref, the offset voltage can be cancelled. In addition, since both IRf and Iref have the same temperature characteristics, temperature characteristics of the VIN and Vref of the I/V conversion operational amplifier 13 can be cancelled and thus the offset voltage can have good temperature characteristics.

Third Exemplary Embodiment

Figure 6:
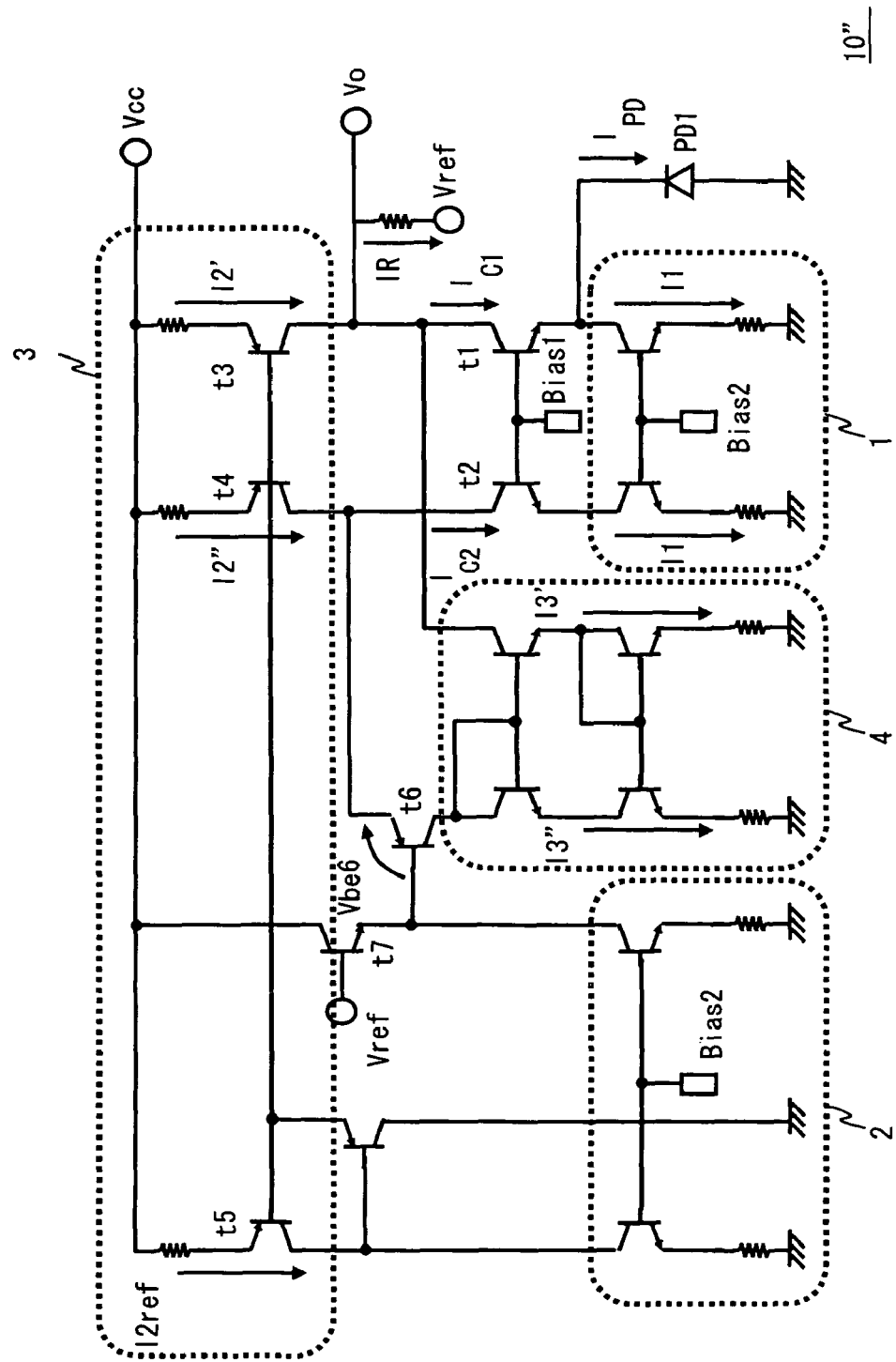
FIG. 6 is a diagram showing a configuration of a photoreceiving circuit provided with a buffer circuit according to a third exemplary embodiment.
Figure 7:
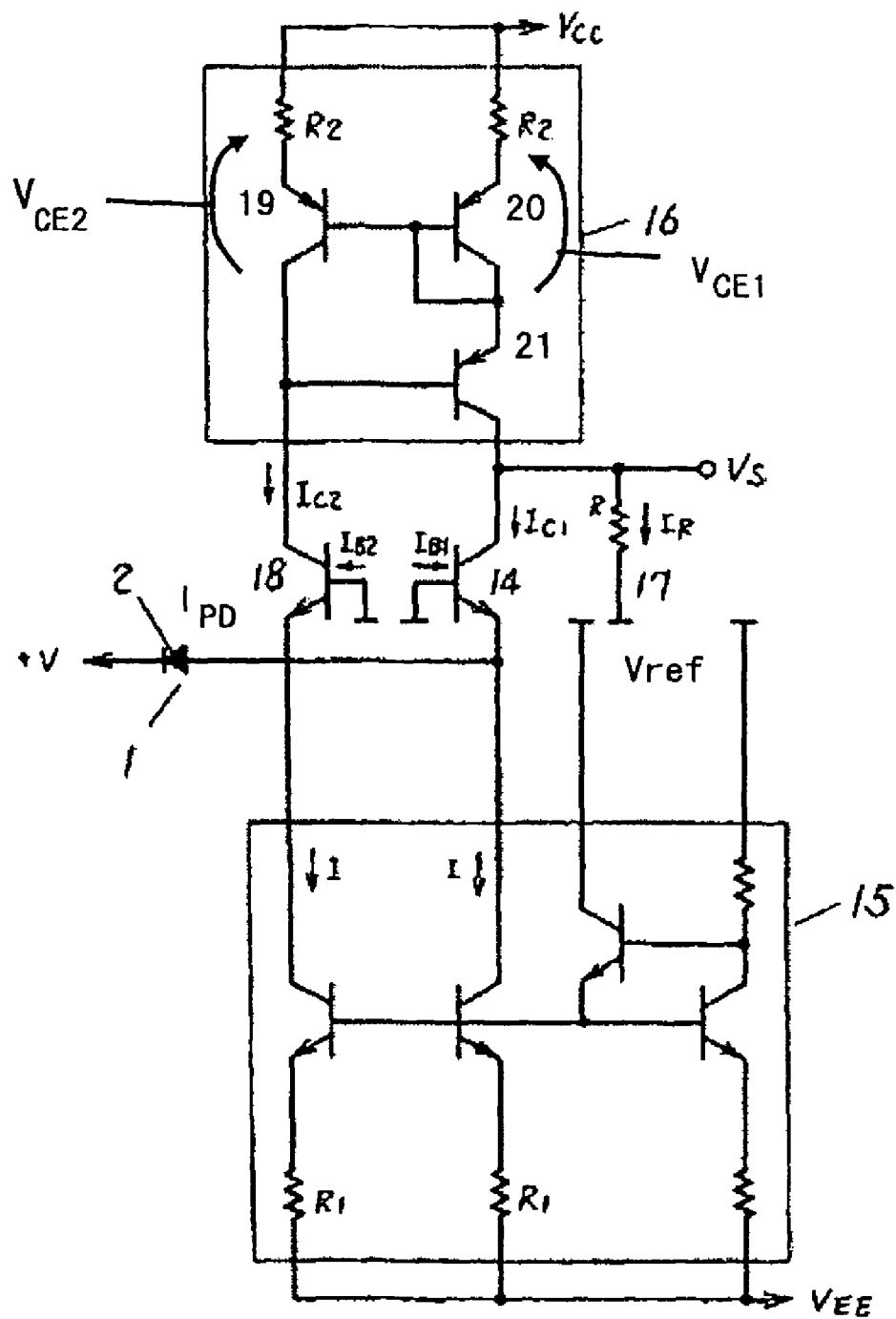
FIG. 7 is a diagram showing a related photoreceiving circuit.

Referring to FIG. 6, a description is given of a photoreceiving circuit provided with a buffer circuit according to third exemplary embodiment of the present invention. FIG. 6 is a diagram showing a configuration of a photoreceiving circuit 10" according to the third exemplary embodiment. In the photoreceiving circuit 10" shown in FIG. 6, although the circuit configuration is approximately equivalent to that of the first exemplary embodiment, improvement is made for the difference between the collector-emitter voltages of the transistors t3 and t4 of the first mirror circuit 3, and further, the photoreceiving circuit 10" has a configuration of allowing improvements in absolute value of the offset voltage.

As shown in FIG. 6, in the photoreceiving circuit 10", an emitter of a transistor t7 is connected to a base of a transistor t6 determining the collector voltage of the transistor t4. In addition, the base voltage of the transistor t7 is voltage Vref.

In the first exemplary embodiment, while the collector voltage of the transistor t3 is voltage Vref, the collector voltage of the transistor t4 is configured with voltage Vref+Vbe6. Accordingly, a difference between the voltages by Vbe6 is generated. In third exemplary embodiment however, it is possible to determine the collector voltage of the transistor t4 as voltage Vref+Vbe6−Vbe7≈voltage Vref. Consequently, there is no difference between the collector-emitter voltages of the transistors t3 and t4 and the absolute values of currents I$_2$' and I$_2$" become equivalent, and thereby the absolute value of the offset voltage is improved.

As described above, according to the present invention, in the photoreceiving circuit having PD as the input source, connecting PD to the emitter of the common base transistor enables to reduce the influence from the parasitic capacitance of PD and obtain stable frequency characteristics. In addition, by eliminating a collector-base short circuit of the transistor configured with a current mirror and providing voltage Vref or a voltage with equivalent variation for the collector voltage of the transistor, the power supply voltage dependence of the offset voltage can be improved.

The first, second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A photoreceiving circuit comprising:
   a buffer circuit that comprises:
      a first transistor having a base connected to a first power supply, an emitter as a current signal input node, and a collector as a current signal output node;
      a second transistor having a base connected to the first power supply;
      a first constant current circuit using a difference between outgoing current from the emitter of the first transistor and an input current at the current signal input node as a constant current, and determining outgoing current from the emitter of the second transistor as a current same as the constant current; and
      a first mirror circuit that makes a collector current of the first transistor equal to a collector current of the second transistor, the first mirror circuit having a third transistor with a collector connected to the collector of the first transistor and a fourth transistor with a collector connected to a collector of the second transistor, the buffer circuit being configured such that a first operating point voltage is provided to the current signal output node between the third transistor and the first transistor and a second operating point voltage based on the first operating point voltage is provided to a node between the fourth transistor and the second transistor;
   a photoreceiving device connected to the current signal input node; and
   a current-voltage conversion circuit connected to the current signal output node.

2. The photoreceiving circuit according to claim 1, wherein the first mirror circuit includes a fifth transistor as a reference.

3. The photoreceiving circuit according to claim 2, further comprising a sixth transistor to provide the second operating point voltage for a node between the fourth transistor and the second transistor.

4. The photoreceiving circuit according to claim 3, further comprising a seventh transistor having an emitter connected to a base of the sixth transistor,
   wherein a voltage provided to the node between the fourth transistor and the second transistor and a voltage provided to the current signal output node are determined as approximately equal.

5. The photoreceiving circuit according to claim 1, further comprising a second mirror circuit to flow therethrough a differential current between the currents in the first constant current circuit and the first mirror circuit.

6. The photoreceiving circuit according to claim 5, further comprising a sixth transistor to provide the second operating point voltage for a node between the fourth transistor and the second transistor.

7. The photoreceiving circuit according to claim 6, further comprising a seventh transistor having an emitter connected to a base of the sixth transistor,
   wherein a voltage provided to the node between the fourth transistor and the second transistor and a voltage provided to the current signal output node are determined as approximately equal.

8. The photoreceiving circuit according to claim 1, further comprising a sixth transistor to provide the second operating point voltage for a node between the fourth transistor and the second transistor.

9. The photoreceiving circuit according to claim 8, further comprising a seventh transistor having an emitter connected to a base of the sixth transistor,
wherein a voltage provided to the node between the fourth transistor and the second transistor and a voltage provided to the current signal output node are determined as approximately equal.

10. A photoreceiving circuit comprising:
a photoreceiving device connected to the current signal input node;
a current-voltage conversion circuit connected to the current signal output node; and
a first buffer circuit provided on an input side of the current-voltage conversion circuit, and a second buffer circuit provided on a reference side,
wherein each of the first buffer circuit and the second buffer circuit comprises:
a first transistor having a base connected to a first power supply, an emitter as a current signal input node, and a collector as a current signal output node;
a second transistor having a base connected to the first power supply;
a first constant current circuit using a difference between outgoing current from the emitter of the first transistor and an input current at the current signal input node as a constant current, and determining outgoing current from the emitter of the second transistor as a current same as the constant current; and
a first mirror circuit that makes a collector current of the first transistor equal to a collector current of the second transistor, the first mirror circuit has a third transistor with a collector connected to the collector of the first transistor and a fourth transistor with a collector connected to a collector of the second transistor,
a first operating point voltage is provided to the current signal output node between the third transistor and the first transistor, and
a second operating point voltage based on the first operating point voltage is provided to a node between the fourth transistor and the second transistor.

11. The photoreceiving circuit according to claim 10, wherein the first mirror circuit includes a fifth transistor as a reference.

12. The photoreceiving circuit according to claim 11, further comprising a sixth transistor to provide the second operating point voltage for a node between the fourth transistor and the second transistor.

13. The photoreceiving circuit according to claim 12, further comprising a seventh transistor having an emitter connected to a base of the sixth transistor,
wherein a voltage provided to the node between the fourth transistor and the second transistor and a voltage provided to the current signal output node are determined as approximately equal.

14. The photoreceiving circuit according to claim 10, further comprising a second mirror circuit to flow therethrough a differential current between the currents in the first constant current circuit and the first mirror circuit.

15. The photoreceiving circuit according to claim 14, further comprising a sixth transistor to provide the second operating point voltage for a node between the fourth transistor and the second transistor.

16. The photoreceiving circuit according to claim 15, further comprising a seventh transistor having an emitter connected to a base of the sixth transistor,
wherein a voltage provided to the node between the fourth transistor and the second transistor and a voltage provided to the current signal output node are determined as approximately equal.

17. The photoreceiving circuit according to claim 10, further comprising a sixth transistor to provide the second operating point voltage for a node between the fourth transistor and the second transistor.

18. The photoreceiving circuit according to claim 17, further comprising a seventh transistor having an emitter connected to a base of the sixth transistor,
wherein a voltage provided to the node between the fourth transistor and the second transistor and a voltage provided to the current signal output node are determined as approximately equal.

19. A photoreceiving circuit comprising:
a first transistor having a base connected to a first power supply and provided between a photoreceiving device and a current-voltage conversion circuit;
a second transistor having a base connected to the first power supply;
a first constant current circuit using a difference between outgoing current from the emitter of the first transistor and an input current at the current signal input node as a constant current, and determining outgoing current from the emitter of the second transistor as a current same as the constant current;
a first mirror circuit that makes a collector current of the first transistor equal to a collector current of the second transistor; and
a second constant current circuit functioning as a reference current of the first mirror circuit,
wherein the first mirror circuit has a third transistor with a collector connected to the collector of the first transistor and a fourth transistor with a collector connected to a collector of the second transistor,
a first operating point voltage is provided to the current signal output node between the third transistor and the first transistor, and
a second operating point voltage based on the first operating point voltage is provided to a node between the fourth transistor and the second transistor.

* * * * *